United States Patent
Youssoufian et al.

(10) Patent No.: US 9,236,851 B2
(45) Date of Patent: *Jan. 12, 2016

(54) PHASE-LOCKED LOOP BASED CONTROLLER FOR ADJUSTING AN ADAPTIVE CONTINUOUS-TIME FILTER

(75) Inventors: Edward Youssoufian, Irvine, CA (US); David Yates, Steeple Morden (GB); Aly M. Ismail, Irvine, CA (US); Geoffrey Hatcher, Orange, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 955 days.

This patent is subject to a terminal disclaimer.

(21) Appl. No.: 13/366,855

(22) Filed: Feb. 6, 2012
(Under 37 CFR 1.47)

(65) Prior Publication Data
US 2012/0133426 A1    May 31, 2012

Related U.S. Application Data

(63) Continuation of application No. 12/960,183, filed on Dec. 3, 2010, now Pat. No. 8,135,365, which is a continuation of application No. 11/737,426, filed on Apr. 19, 2007, now Pat. No. 7,869,780.

(51) Int. Cl.
*H03H 11/12* (2006.01)

(52) U.S. Cl.
CPC ..... *H03H 11/1291* (2013.01); *H03H 2210/021* (2013.01); *H03H 2210/043* (2013.01); *H03J 2200/10* (2013.01)

(58) Field of Classification Search
CPC .......... H03H 11/1291; H03H 2210/021; H03H 2210/043; H03J 2200/10
USPC .......................................................... 455/73
See application file for complete search history.

(56) References Cited

U.S. PATENT DOCUMENTS

| 4,163,218 | A | 7/1979 | Wu |
| 5,303,406 | A | 4/1994 | Hansen et al. |
| 5,311,546 | A | 5/1994 | Paik et al. |
| 5,345,119 | A | 9/1994 | Khoury |
| 5,596,600 | A | 1/1997 | Dimos et al. |
| 7,522,847 | B2 * | 4/2009 | Momtaz et al. ............... 398/209 |
| 7,869,780 | B2 | 1/2011 | Youssoufian et al. |
| 2005/0181741 | A1 | 8/2005 | Raj et al. |
| 2011/0075777 | A1 | 3/2011 | Youssoufian et al. |

* cited by examiner

*Primary Examiner* — Manuel Mendez
(74) *Attorney, Agent, or Firm* — Knobbe Martens Olson & Bear LLP

(57) ABSTRACT

A direct conversion radio-frequency (RF) receiver includes a controller and an adaptive continuous-time filter. The adaptive continuous-time filter receives a multiple-bit control signal generated by the controller to adjust a characteristic of the continuous-time filter. The controller generates the multiple-bit control signal in response to process variation in the semiconductor material used to implement the controller and the adaptive continuous-time filter. A method for tuning an adaptive continuous-time filter comprises determining a RC time constant, converting the RC time constant to a digital word, comparing a select bit of the digital word to a respective bit of a predetermined reference word to generate a control bit, applying the control bit to an adjustable element to modify the RC time constant, repeating the determining, converting, comparing and applying steps until the control bits generate an output word and providing the output word to the adaptive continuous-time filter.

20 Claims, 8 Drawing Sheets

PHASE-LOCKED LOOP BASED CONTROLLER FOR ADJUSTING AN ADAPTIVE CONTINUOUS-TIME FILTER

This application is a continuation of U.S. application Ser. No. 12/960,183, filed Dec. 3, 2010, which is a continuation of U.S. application Ser. No. 11/737,426, filed on Apr. 19, 2007, now U.S. Pat. No. 7,869,780, the entireties of which are hereby incorporated herein by reference to be considered part of this specification.

BACKGROUND

Radio frequency (RF) transceivers are found in many two-way communication devices, such as portable communication devices, (cellular telephones), personal digital assistants (PDAs) and other communication devices. A RF transceiver must transmit and receive RF signals dictated by the particular communication protocol under which the communication device is operating. For example, RF communication protocols include amplitude modulation, frequency modulation, phase modulation, or a combination of these. A typical code-division multiple-access (CDMA) communication system, uses a direct-conversion receiver with a matching filter to separate the appropriate data or output signal from the received baseband signal.

A direct-conversion receiver, also known as a homodyne, synchrodyne, or zero-intermediate frequency (IF) receiver, is a radio receiver design that uses a unique system of demodulating amplitude-modulated (AM) signals. It uses a local oscillator, synchronized in frequency to the carrier of the desired signal, to modulate the received signal. Thereafter, the matching filter is used to separate the appropriate output signal from the received baseband signal.

Consequently, filter tuning or adjusting is often performed in direct-conversion and low-IF receivers. It is well established that it is more convenient to design continuous-time filters for channel selection instead of switched-capacitor filters due to physical area requirements and dynamic range constraints of the respective filter circuits. However, continuous-time filters require tuning since their cut-off frequency depends on a factor (i.e., a resistor-capacitor (RC) time constant), which is sensitive to manufacturing process variation and operating temperature of the various components used to implement the filter.

In CDMA applications, an in-band blocker profile, for a receive channel, dictates that the cut-off frequency should be accurate to within ±2.5% of the nominal cut-off frequency. A first simulated variation of cut-off frequency for a continuous-time filter due to process variation shows that the cut-off frequency of an active continuous-time filter will vary by more than ±10.0% of the nominal cut-off frequency due to process variation. A second simulated variation in cut-off frequency for a continuous-time filter due to temperature variation is less than ±1.0%. Consequently, a tuning scheme that neutralizes the effects of at least process variation on the cut-off frequency of a continuous-time filter is desired.

There are several conventional ways to tune continuous-time filters. One common way is to construct a master voltage-controlled oscillator (VCO) whose oscillation frequency is proportional to the slave's (i.e., the matching filter's) cut-off frequency. The tuning, in this case, is performed by a phase-locked loop (PLL). Typically, the filter comprises a combination of an operational amplifier with resistors and capacitors arranged in a feedback path. In this arrangement, a digital PLL can be used as one or both of resistance and capacitance can be adjusted by discretely switching select resistors and capacitors in the feedback path. This method provides good accuracy at the expense of the additional circuit area required implementing the VCO and the relatively large components required to bring the matching of the master and slave filters to a desired level.

A second way to tune a continuous-time filter is by estimating an RC-time constant on an integrated circuit. This is generally accomplished by charging an RC load with a voltage or current source and adjusting the RC-time constant to achieve a desired response. This method is attractive due to its simplicity. However, for high-frequency applications, this method suffers from sensitivity to component mismatch and amplifier offsets.

The CDMA standard presents at least two additional problems. First, the CDMA standard does not provide a time slot to check and/or adjust filters. Second, the CDMA standard dictates that filter performance must not be degraded while the host communication device is operational.

SUMMARY

Embodiments of a direct-conversion RF receiver include a controller and a direct-conversion receive path comprising a continuous-time filter. The continuous-time filter receives a multiple-bit control signal generated by the controller to adjust a characteristic of the continuous-time filter. The controller generates the multiple-bit control signal in response to process variation in the semiconductor material used to implement the controller and the continuous-time filter.

An embodiment of a method for tuning an adaptive continuous-time filter comprises determining a RC-time constant, converting the RC-time constant to a digital word, comparing a select bit of the digital word to a respective bit of a predetermined reference word to generate a control bit, applying the control bit to an adjustable element to modify the RC-time constant, repeating the determining, converting, comparing and applying steps until the control bits generate an output word and providing the output word to the adaptive continuous-time filter.

The figures and detailed description that follow are not exhaustive. The disclosed embodiments are illustrated and described to enable one of ordinary skill to make and use the controller to adjust a continuous-time filter to counter the effects due to semiconductor manufacturing process variation in the output of the filter. Other embodiments, features and advantages of the controller and method for adjusting a continuous-time filter will be or will become apparent to those skilled in the art upon examination of the following figures and detailed description. All such additional embodiments, features and advantages are within the scope of the circuits and methods as defined in the accompanying claims.

BRIEF DESCRIPTION OF THE DRAWINGS

The controller and method for adjusting a continuous-time filter can be better understood with reference to the following figures. The components within the figures are not necessarily to scale, emphasis instead being placed upon clearly illustrating the principles of operation. Moreover, in the figures, like reference numerals designate corresponding parts throughout the different views.

DETAILED DESCRIPTION

Figure 1:
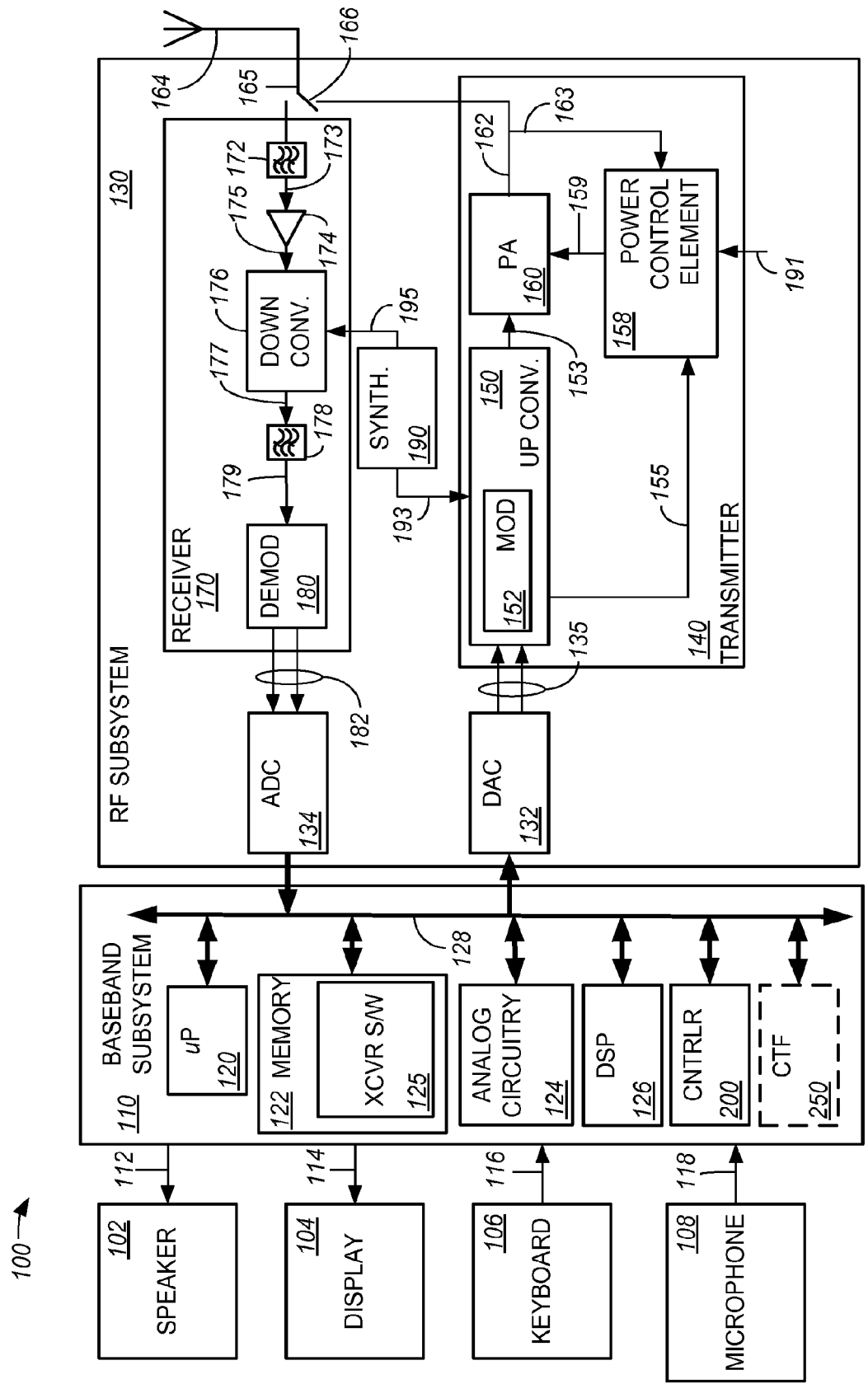
FIG. 1 is a block diagram illustrating a simplified portable transceiver.

Although described with particular reference to a portable transceiver operating in a CDMA communication system, the controller can be implemented in any system where it is desirable to adjust a continuous-time filter. The controller uses a digital PLL to convert an output of an oscillator and to control a set of successive approximation registers responsive to a comparison of the output of the oscillator and a reference word to generate a multiple-bit output word. The multiple-bit output word is applied as a control input to an adaptive continuous-time filter to generate a filter response that accounts for process variation in the resistors and capacitors used to implement the filter. The controller is well-suited for applications that require a fast response that addresses process variation in a semiconductor die.

The oscillator includes an astable multivibrator that generates an output signal with a frequency determined solely by the RC time constant and a ratio of resistors. As a result, there is an excellent match between the RC time constant across the various circuits on a semiconductor die and the output frequency of the astable multivibrator. The output of the oscillator is adjusted in a discrete manner, using switched resistor or capacitor networks. An output or control word is forwarded to an adaptive continuous-time filter, which is configured with a duplicate of the network used to adjust the oscillator. A predetermined reference word is used so that the iterative determination of the control word covers only a portion of the controllable range of the oscillator. In a preferred embodiment, several bits of the output or control word are fixed or hardwired to a digital logic voltage level to further reduce the time it takes the controller to generate the output word.

The controller can be implemented in hardware, software, or a combination of hardware and software. When implemented in hardware, the controller can be implemented using specialized hardware elements and logic. When the controller is implemented partially in software, the software portion can be used to precisely control the reference word. The software can be stored in a memory and executed by a suitable instruction execution system (e.g., a microprocessor). The hardware implementation of the controller can include any or a combination of the following technologies, which are all well known in the art: discrete electronic components, a discrete logic circuit(s) having logic gates for implementing logic functions upon signals, an application specific integrated circuit having appropriate logic gates, a programmable gate array(s) (PGA), a field programmable gate array (FPGA), etc.

Software associated with the controller may comprise an ordered listing of executable instructions for reading a multiple-bit storage element, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, via optical scanning of the paper or other medium, then compiled, interpreted or otherwise processed in a suitable manner if necessary, and then stored in a computer memory.

FIG. 1 is a block diagram illustrating a simplified portable transceiver 100. For simplicity, only basic components of portable transceiver 100 are illustrated and described. Portable transceiver 100 includes speaker 102, display 104, keyboard 106, and microphone 108, all connected to baseband subsystem 110. In a particular embodiment, the portable transceiver 100 can be, for example but not limited to, a portable telecommunication handset such as a mobile cellular-type telephone. The speaker 102 and the display 104 receive signals from the baseband subsystem 110 via connections 112 and 114, respectively, as known to those skilled in the art. Similarly, the keyboard 106 and the microphone 108 supply signals to the baseband subsystem 110 via connections 116 and 118, respectively. The baseband subsystem 110 includes microprocessor (uP) 120, memory 122, analog circuitry 124, digital signal processor (DSP) 126, controller 200 and an adaptive continuous-time filter (labeled CTF) 250 in communication via bus 128. The bus 128, though shown as a single connection, may be implemented using a number of busses connected as necessary among the devices or subsystems within baseband subsystem 110. The microprocessor 120 and the memory 122 provide the signal timing, processing and storage functions for the portable transceiver 100. Portions of the portable transceiver 100 implemented in software are stored in memory 122. For example, in the illustrated embodiment, memory 122 includes transceiver software 125 that can be executed by microprocessor 120, DSP 126, controller 200 or by other circuits and processors communicatively coupled to memory 122.

Analog circuitry 124 provides analog processing functions for both received and internally generated signals within baseband subsystem 110. Some of these internally generated signals may be designated for transmission via radio-frequency (RF) subsystem 130. Baseband subsystem 110 communicates with RF subsystem 130 via bus 128 and signal converters. Consequently, RF subsystem 130 includes both analog and digital components. Generally, RF subsystem 130 includes transmitter 140, transmit/receive switch 165, receiver 170, and synthesizer 190. In this example, received signals are communicated from receiver 170 to baseband subsystem 110 via analog-to-digital converter (ADC) 134. Similarly, baseband subsystem processed signals are communicated from baseband subsystem 110 to transmitter 140 via digital-to-analog converter (DAC) 132.

DAC 132 may operate on either baseband in-phase (I) and quadrature-phase (Q) components or phase and amplitude components of the information signal (i.e., the signal to be transmitted). In the case of I and Q signals, modulator 152 is an I/Q modulator as known in the art, while in the case of phase and amplitude components, modulator 152 operates as a phase modulator utilizing only the phase component and passes the amplitude component, unchanged, to power control element 158. One or more additional DACs (not shown) may be added to provide control signals to various components within RF subsystem 130.

Modulator 152 modulates either the I and Q information signals or the phase information signal received from DAC 132 onto a frequency reference signal referred to as a "local oscillator" or "LO" signal provided by synthesizer 190 via connection 193. In this example, modulator 152 is part of upconverter 150, but it should be understood that modulator 152 may be separate from upconverter 150.

Modulator 152 also supplies an intermediate frequency (IF) signal containing only the desired amplitude modulated (AM) signal component for input to power control element 158 via connection 155. The AM signal supplied by modulator 152 via connection 155 is supplied to a reference variable gain element associated with power control element 158. The AM signal supplied by modulator 152 is an intermediate frequency (IF) AM signal with a constant (average) power level.

Synthesizer 190 determines the appropriate frequency to which the upconverter 150 will translate the modulated signal. Synthesizer 190 uses one or more voltage-controlled oscillators (VCOs), each operating at a center frequency of approximately 2.5 to 3.0 gigahertz (GHz) and frequency dividers to provide the desired LO signals to transmitter 140 and to receiver 170.

Upconverter 150 supplies a phase modulated signal at the appropriate transmit frequency via connection 153 to power amplifier 160. Power amplifier 160 amplifies the phase-modulated signal on connection 153 to the appropriate power level, as directed by power control element 158 via control interface 159, for transmission via connection 162 to antenna 164. Illustratively, switch 166 controls whether the amplified signal on connection 162 is transferred to antenna 164 or whether a received signal from antenna 164 is supplied to filter 172 in receiver 170. The operation of switch 166 is controlled by a control signal from baseband subsystem 110 via connection 165.

In the illustrated embodiment, a portion of the amplified transmit signal power on connection 162 can be supplied via connection 163 to power control element 158. Power control element 158, connection 159 and connection 163 combine to form a closed-loop power control system that provides a control signal on connection 159 that directs power amplifier 160 as to the power to which the signal on connection 153 should be amplified. Power control element 158 also receives an LO signal from synthesizer 190 via connection 191, which keeps power control element 158 in synchronization with the signal provided by upconverter 150.

A signal received by antenna 164 may, at the appropriate time determined by baseband subsystem 110, be directed via switch 166 to a receive filter 172. The receive filter 72 filters the received signal and supplies the filtered signal on connection 173 to a low noise amplifier (LNA) 174. Although a single LNA 174 is shown in FIG. 1, it is understood that a plurality of LNAs are typically used, depending on the frequency or frequencies on which the portable transceiver 100 operates. Receive filter 172 may be a bandpass filter that passes all channels of the particular cellular system where the portable transceiver 100 is operating. As an example, for a 1900 MHz CDMA system, receive filter 172 would pass all frequencies from 1897.5 MHz to 1902.5 MHz, covering a spread-spectrum bandwidth of 5 MHz. Receive filter 172 rejects all frequencies outside the desired region. LNA 174 amplifies the very weak signal on connection 173 to a level at which downconverter 176 can translate the signal from the received frequency to a baseband frequency. Alternatively, the functionality of the LNA 174 and the downconverter 176 can be accomplished using other elements, such as, for example but not limited to, a low noise block downconverter (LNB). In this example, the receiver 170 operates as a direct conversion receiver (DCR) in which the received RF signal is downconverted directly to a baseband signal.

Downconverter 176 receives one or more LO signals from synthesizer 190 via connection 195. In this embodiment, the LO signals are shifted in phase by approximately 45 degrees to provide frequency translation of the in-phase and the quadrature-phase received signals without the use of polyphase filters or large inductances in the receive signal path. Synthesizer 190 determines the frequency to which to convert the signal received from the LNA 174 via connection 175. In the case of a DCR, the received signal is converted directly to baseband frequencies (e.g., from about 100 kHz to about 630 kHz). Downconverter 176 sends the downconverted signal via connection 177 to channel filter 178. Channel filter 178 selects a desired passband to forward on connection 179 to demodulator 180. Demodulator 180 recovers the transmitted signal information (data and or voice) from a spread spectrum QPSK coded signal and supplies a signal representing this information via connection 182 to the ADC 134. ADC 134 converts these analog signals to a digital signal at baseband frequency and transfers them via bus 128 to one or more of microprocessor 120 or DSP 126 for further processing.

Figure 2:
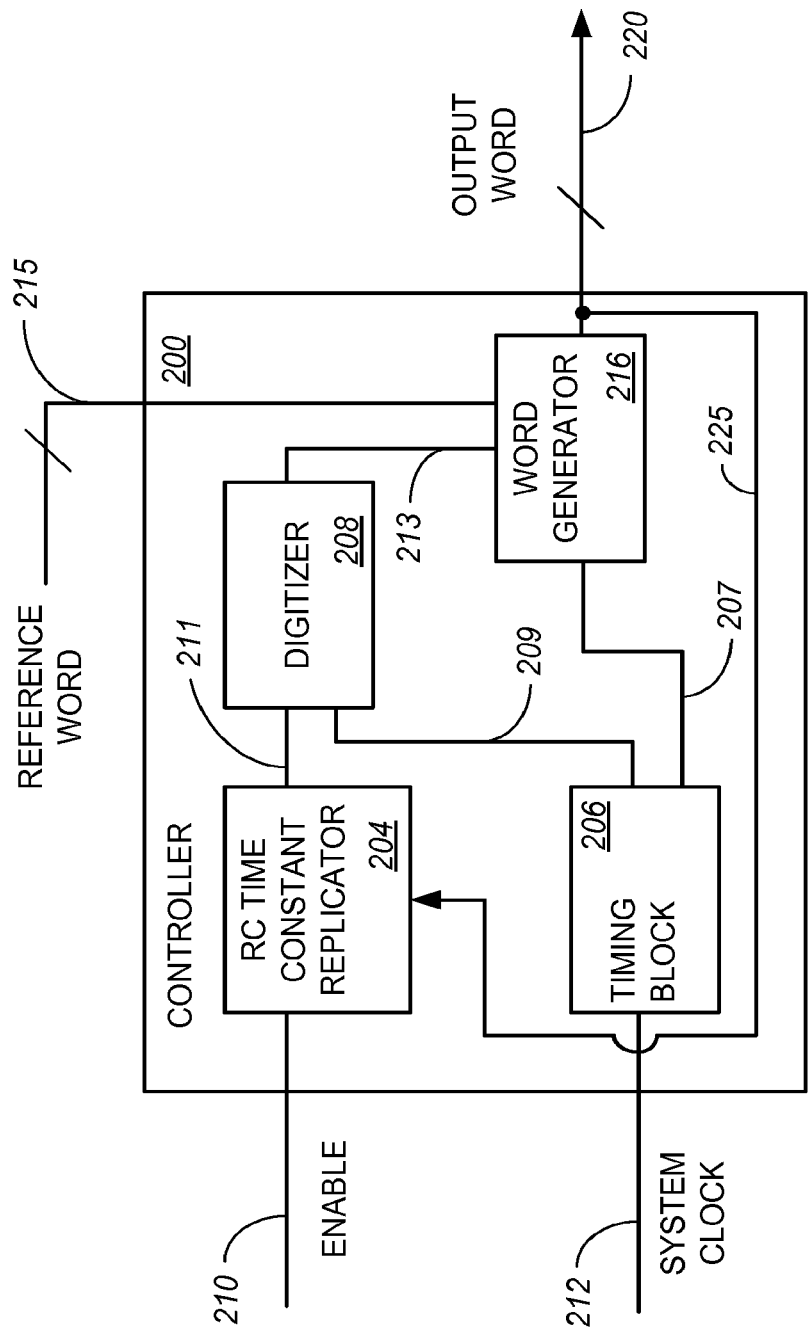
FIG. 2 is a schematic diagram illustrating an embodiment of the controller of FIG. 1.

FIG. 2 is a schematic diagram illustrating an embodiment of the controller 200 of FIG. 1. Controller 200 receives an enable signal input along connection 210, a system clock signal along connection 212 and a reference word along connection 215. In an iterative process, controller 200 generates a multiple-bit output or control word, which is forwarded along connection 220. Controller 200 includes RC time constant replicator 204, timing block 206, digitizer 208 and word generator 216. As illustrated in FIG. 2, RC time constant replicator 204 is coupled to connection 210, connection 220 and connection 211. RC time constant replicator 204 generates a time-varying output signal that oscillates at a frequency that is a function of the RC time constant for resistors and capacitors implemented on a semiconductor material. The time-varying output signal is applied along connection 211 to digitizer 208. Timing block 206 receives a system clock signal along connection 212 and forwards a first timing signal via connection 209 to digitizer 208 and a second timing signal via connection 207 to word generator 216. Digitizer 208 generates a multiple output digital signal in response to the number of signal transitions in the time-varying output signal forwarded along connection 211 by the RC time constant replicator 204 in accordance with a timing control signal forwarded by timing block 206 along connection 209. The multiple output digital signal is forwarded from digitizer 208 to word generator 216 along connection 213. Word generator 216 receives the digitizer output signal and reference word and generates an output word or correction signal in accordance with a second timing signal forwarded by timing block 206 along connection 207. The output word or correction signal is returned along connection 225 to RC time constant replicator 204 to adjust one or more resistive or capacitive elements to adjust the output response in a desired manner.

For example, when the time-varying output signal forwarded along connection 211 indicates that the RC time constant is smaller than expected, which results in one or more undesired characteristics in an active filter implemented with resistors and capacitors on the same semiconductor die as those in RC time constant replicator 204, the output word on connection 220 directs the RC time constant replicator 204 to increase the RC time constant in a controlled manner. The adjusted output signal of the RC time constant replicator 204 is forwarded to digitizer 208 and word generator 216 to generate successively finer control adjustments until the desired output response is obtained. When the time-varying output signal indicates that the RC time constant is greater than expected, which results in undesired characteristics in an active filter implemented with resistors and capacitors on the same semiconductor die as those in the RC time constant replicator 204, the output word on connection 220 directs the RC time constant replicator 204 to decrease the RC time constant in a controlled manner. As described above, the adjusted output signal of the RC time constant replicator 204 is processed by controller 200 until a desired response time as defined by the first and second timing signals from timing block 206 is obtained. The output word is then available for application to adjust active filters, such as adaptive continuous-time filter 250 (FIG. 1).

Figure 3:
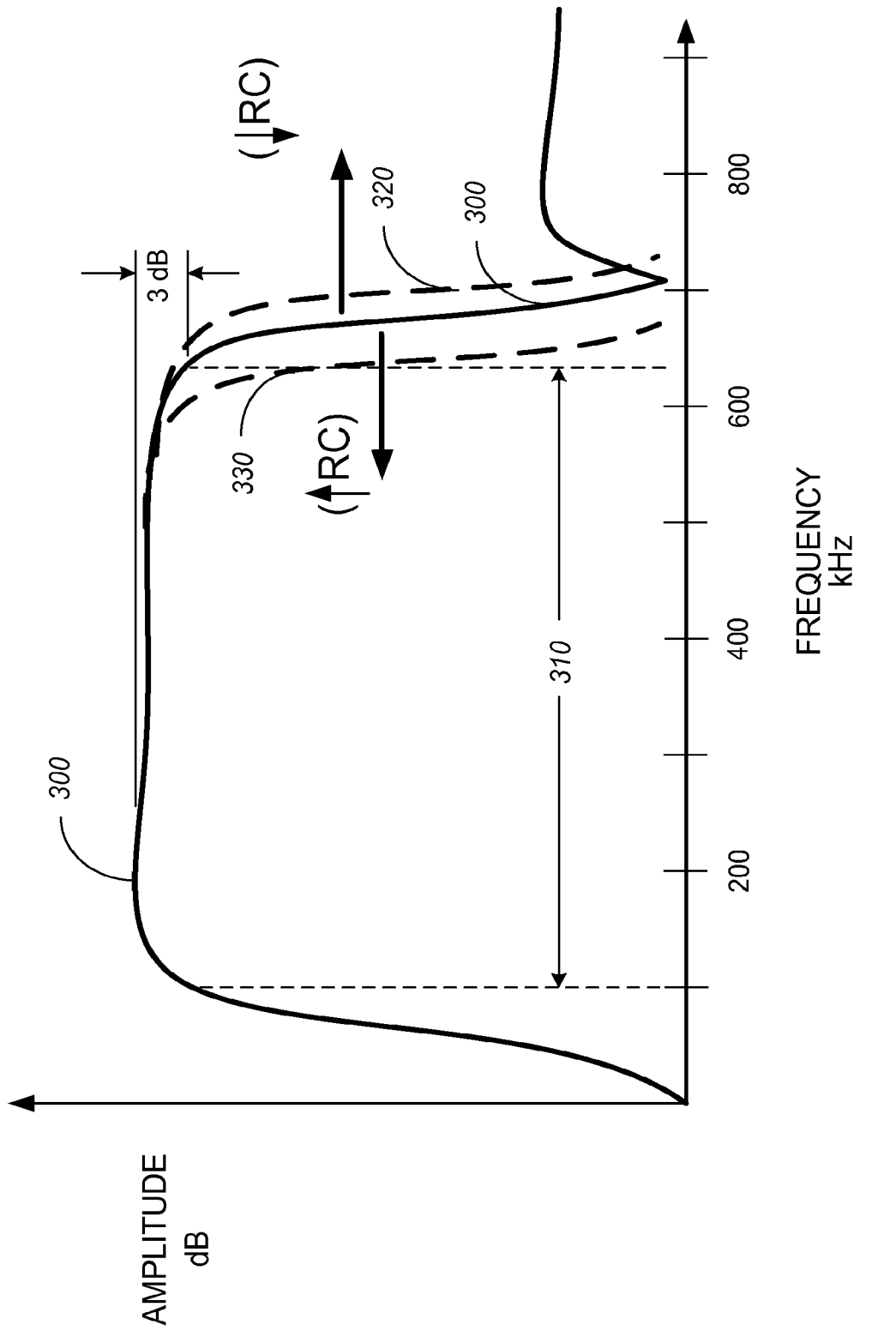
FIG. 3 is a graph illustrating the result of interaction of the controller and continuous-time filter of FIG. 1 on an example baseband channel.

FIG. 3 is a graph illustrating the result of interaction of the controller 200 and the continuous-time filter 250 of FIG. 1 on an example passband. Bandpass filters allow the transmission of a range of frequencies between a lower and an upper cutoff limit. These filters are ideal for signal selection within a given frequency range. Traditional filter transfer functions are implemented with passive or active circuit topologies. Passive filter circuits use individual resistors, capacitors and inductors; whereas active filter circuits use operational amplifiers with resistors and capacitors in various feedback arrangements. Unique filter transfer function characteristics are implemented with active filters by selecting resistor and capacitor values in a specified feedback topology and by adjusting the filter's amplifier gain. With an ideal bandpass filter, the filter's transfer function applies equally to all frequencies within the range or band with no amplitude variations within the filter's passband. Signals at frequencies outside the passband are sharply attenuated or blocked. Frequencies where the filter's power response has dropped 50% or 1/√2 (0.707) of the desired output voltage are defined as "cutoff" frequencies. Bode plots locate these cutoff frequencies 3 decibels below the flat midrange of the filter's response trace.

In the plot of FIG. 3, filter output is illustrated as a function of magnitude (amplitude) in decibels and frequency in kHertz. Trace 300 depicts an example bandpass filter output having a passband 310 from approximately 100 kHz to approximately 630 kHz. As shown by trace 320 and the rightward pointing arrow, a decrease in the magnitude of the product of the resistance and capacitance in the filter circuit results in an increase in the high-frequency cutoff frequency from the nominal 630 kHz. Conversely, trace 330 and the leftward pointing arrow, show that an increase in the magnitude of the product of the resistance and capacitance in the filter circuit results in a decrease in the high-frequency cutoff frequency from the nominal 630 kHz. Thus, process variation in the semiconductor manufacturing process used to produce semiconductor-based resistive and capacitive elements can have an undesirable effect on a filter's cutoff frequency.

Figure 4:
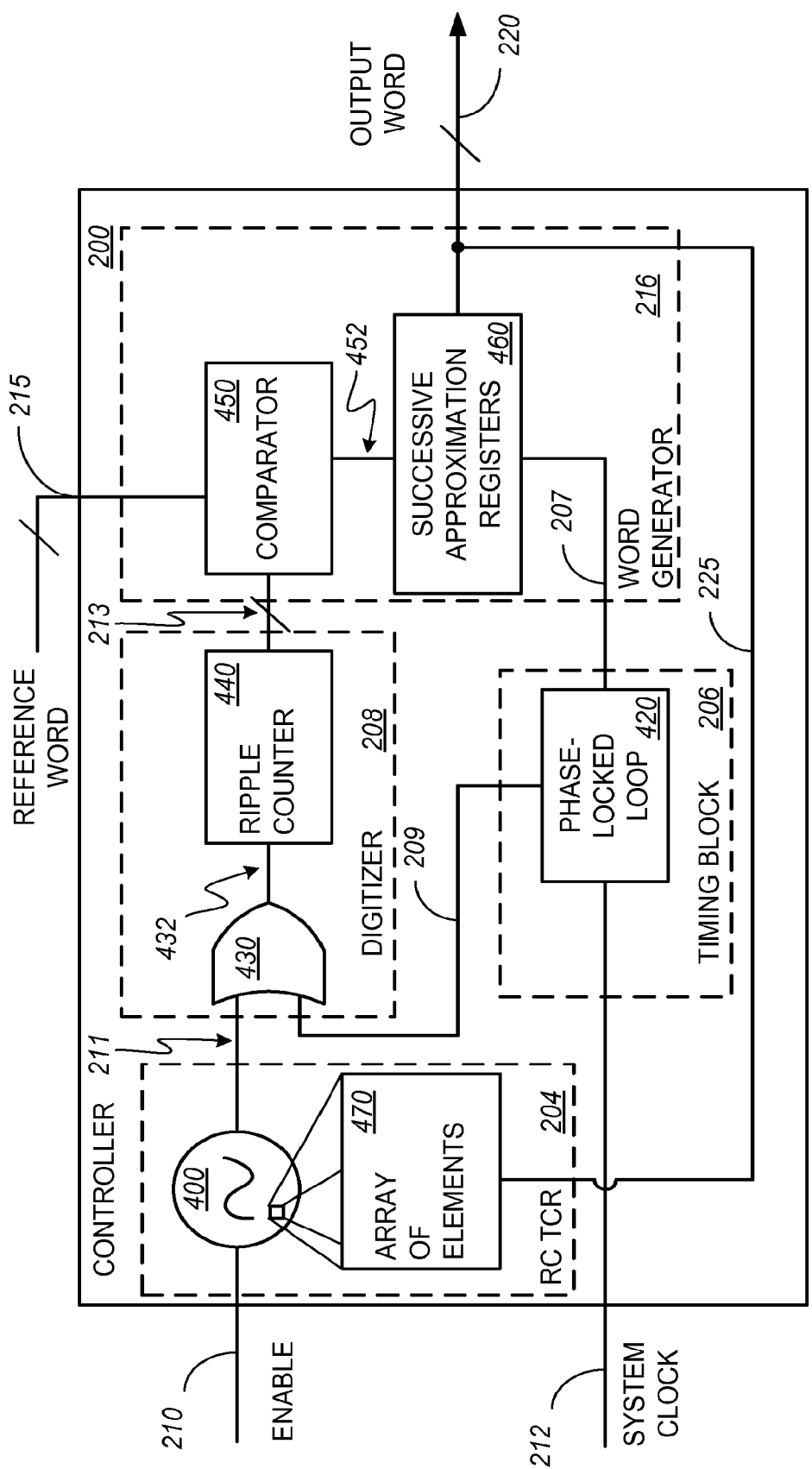
FIG. 4 is a block diagram illustrating an embodiment of the controller of FIG. 2 in greater detail.

FIG. 4 is a block diagram illustrating an embodiment of the controller 200 of FIG. 2 in greater detail. Controller 200 includes oscillator 400, OR gate 430, ripple counter 440, comparator 450 and successive approximation registers 460. Oscillator 400 operates in accordance with an enable signal received on connection 210 and generates a time-varying output signal along connection 211, which is coupled to a first input of OR gate 430. The output of OR gate 430 is coupled to the input of ripple counter 440 via connection 432. Ripple counter 440 produces a multiple bit output along connection 213. Respective bits of the multiple-bit output from ripple counter 440 and from a reference word provided along connection 215 are forwarded to comparator 450. Comparator 450 generates an error bit when the respective bits from the ripple counter 440 and reference word do not match. The error bit is forwarded via connection 452 to successive approximation registers 460, which generate respective bits of an output or control word. The output word is forwarded via connection 220 to continuous-time filter 250 (FIG. 1) via bus 128 (FIG. 1) or to analog circuitry 124 to account for semiconductor process variation. As shown in FIG. 4, the output word is returned to an array of elements 470, within oscillator 400, via connection 225 to adjust the frequency of the output signal produced by oscillator 400.

Ripple counter 440 and the successive approximation registers 460 operate in accordance with respective signals from timing block 206. In this regard, timing block 206 receives a system reference clock on connection 212 and forwards a first timing signal along connection 209 to a first input of OR gate 430. Timing block 206 forwards a second timing signal along connection 207 to the successive approximation registers 460. In an example embodiment, the system clock provided on connection 212 has a frequency of 19.2 MHz, the output or control word consists of 8 bits with the three most significant bits of the 8-bit word being fixed or hardwired to respective digital voltage levels and the five (5) least significant bits being used to adjust the array of elements 470 to controllably modify the output frequency of the oscillator 400. With the three (3) most significant bits of the 8-bit output word hardwired, controller 200 generates the output word in $2^{8-3}$ clock cycles. Using a reference or system clock frequency of 19.2 MHz, the controller 200 generates the output word in under 2 μSec.

Figure 5:
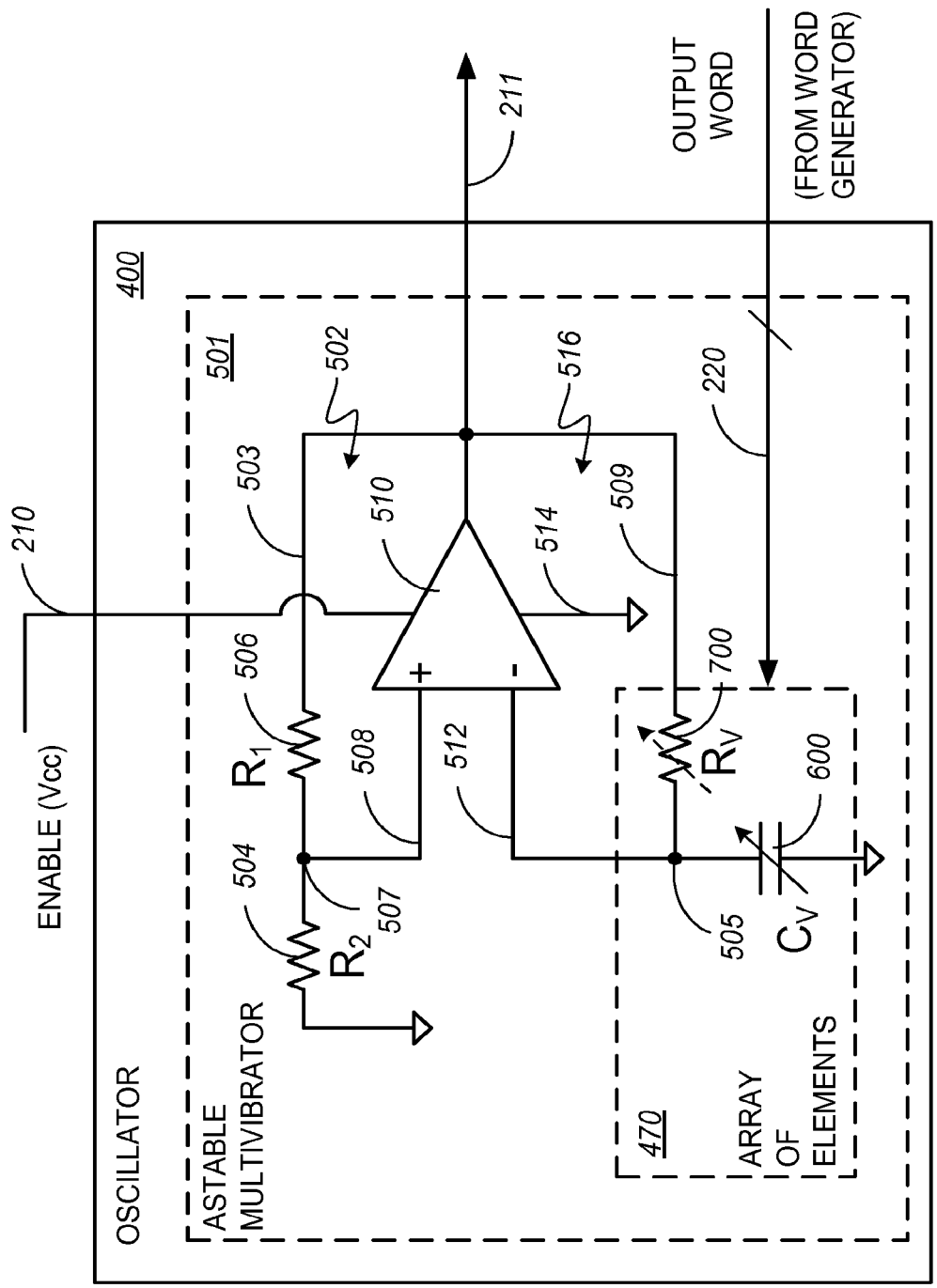
FIG. 5 is a schematic diagram illustrating an embodiment of the oscillator of FIG. 4.

FIG. 5 is a schematic diagram illustrating an embodiment of the oscillator 400 of FIG. 4. Oscillator 400 receives DC power via connection 210 and produces a time-varying output signal on connection 211. Oscillator 400 includes an astable multivibrator 501 implemented with operational amplifier 510 configured with positive feedback loop 502 and negative feedback loop 516 and connection 514 coupled to electrical ground. Positive feedback loop 502 includes connection 503 at the output of operational amplifier 510, resistor 506 ($R_1$) and connection 508 between node 507 and the positive input of operational amplifier 510. Negative feedback loop 516 includes connection 509 at the output of operational amplifier 510, resistor 700 ($R_v$) and connection 512 between node 505 and the inverting or negative input of operational amplifier 510. Astable multivibrator 501 further includes resistor 504 (R2) coupled between node 507 and electrical ground and capacitor 600 coupled between node 505 and electrical ground. Equation 1 below reveals that the period of the time-varying output signal produced by oscillator 400 is a function of $R_1$, $R_2$, $R_v$ and $C_v$. Equation 2 reveals the well known relationship between period and frequency of a time-varying signal.

$$T_{out} = RC \ln\left(\frac{1 + \frac{R_1}{R_2}}{1 - \frac{R_1}{R_2}}\right)$$ Equation 1

$$f = \frac{1}{T_{out}}$$ Equation 2

Thus, the frequency of the time-varying output signal is a function of the ratio of the resistance values of resistors $R_1$, and $R_2$ and the capacitance of variable capacitor 600 ($C_v$) and resistor 700 ($R_v$).

As further illustrated in FIG. 5, output word is received along connection 220 from word generator 216 (FIG. 2) and forwarded to array of elements 470, which uses the output word to configure one or both of variable capacitor 600 and variable resistor 700 to adjust the output of oscillator 400. Alternative embodiments of such circuit arrangements are described below in connection with FIGS. 6 and 7.

Figure 6:
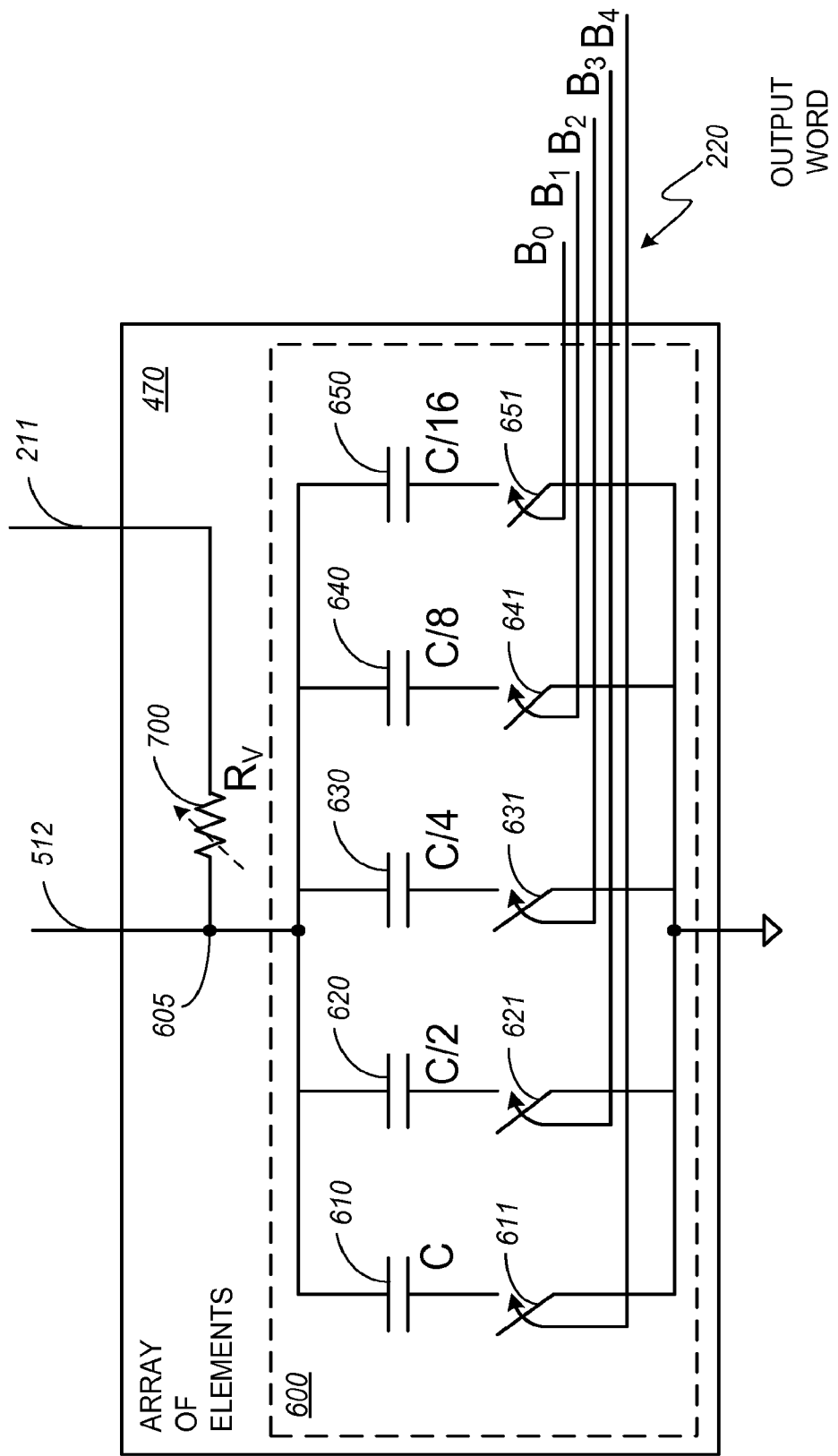
FIG. 6 is a schematic diagram illustrating an embodiment of the array of elements of FIG. 4.

FIG. 6 is a schematic diagram illustrating an embodiment of the array of elements 470 of FIG. 4. Array of elements 470 is coupled between the output of the operational amplifier 510 of the astable multivibrator 501 of FIG. 1 and electrical ground, with the output of operational amplifier 510 being coupled via connection 211. In addition, node 605 between resistor 700 and variable capacitor 600 is coupled to the inverting input of operational amplifier 510 via connection 512.

Variable capacitor 600 comprises a network of capacitors coupled in parallel with a respective capacitor under the switched control of a corresponding bit of the output word. Capacitor 610, having a capacitance of C picofarads (pF), is coupled in series with switch 611, which operates in accordance with the state of bit $B_4$ of the example 5-bit output word 220. Capacitor 620, having a capacitance of C/2 pF, is coupled in series with switch 612, which operates in accordance with the state of bit $B_3$ Capacitor 630, having a capacitance of C/4 pF, is coupled in series with switch 631, which operates in accordance with the state of bit $B_2$ Capacitor 640, having a capacitance of C/8 pF, is coupled in series with switch 641, which operates in accordance with the state of bit $B_1$ Capacitor 650, having a capacitance of C/16 pF, is coupled in series with switch 651, which operates in accordance with the state of bit $B_0$ Accordingly, the capacitance of variable capacitor 600 can be controllably adjusted to one of 32 ($2^N$) discrete values. When resistor 700 is held constant, the RC time constant is discretely adjusted by controllably opening or closing one or more of switch 611, switch 621, switch 631, switch 641, and switch 651.

Alternative arrangements are possible and contemplated. For example, one or more capacitors having various capacitances can be added in series with one or more of the illustrated capacitors. By way of further example, the relationship between the capacitance of anyone of the example capacitors and the binary weight of the corresponding control bit may be changed. That is, instead of control bit $B_0$ of output word 220 resulting in the addition of C/16 pF of capacitance to the overall value of variable capacitor 600, if capacitor 650 is replaced by a capacitor having a capacitance of C/12, the closing of switch 651 adds a capacitance that is no longer directly related to the binary value of output word 220.

Figure 7:
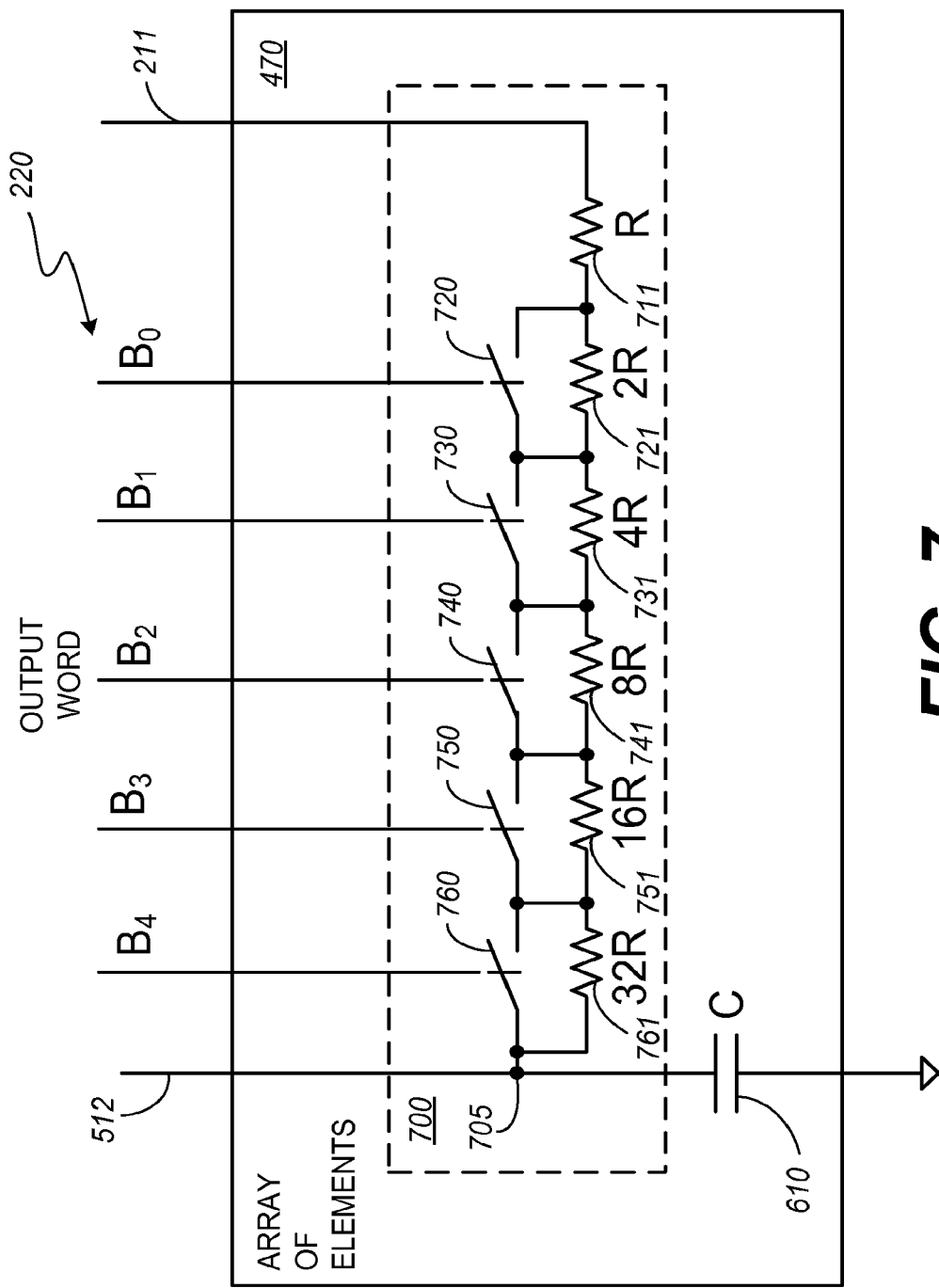
FIG. 7 is a schematic diagram illustrating an alternative embodiment of the array of elements of FIG. 4.

FIG. 7 is a schematic diagram illustrating an alternative embodiment of the array of elements 470 of FIG. 4. Array of elements 470 is coupled between the output of the operational amplifier 510 of the astable multivibrator 501 of FIG. 1 and electrical ground, with the output of operational amplifier 510 being coupled to array of elements 470 via connection 211. In addition, node 705 between variable resistor 700 and capacitor 610 is coupled to the inverting input of operational amplifier 510 via connection 512.

Variable resistor 700 comprises a network of resistors coupled in series with each respective resistor with the exception of resistor 711 under the switched control of a corresponding bit of the output word. Resistor 711, having a resistance of R kOhms, is coupled to resistor 721, resistor 731, resistor 741, resistor 751 and resistor 761. Each successive resistor in the resistor network has a resistance that is a factor of $2^N$ higher than the preceding resistor. Resistor 721, having a resistance of 2R kOhms, is coupled in parallel with switch 720, which operates in accordance with bit Bo. Resistor 731, having a resistance of 4R kOhms, is coupled in parallel with switch 730, which operates in accordance with bit B1. Resistor 741, having a resistance of 8R kOhms, is coupled in parallel with switch 740, which operates in accordance with bit $B_2$. Resistor 751, having a resistance of 16R kOhms, is coupled in parallel with switch 750, which operates in accordance with bit $B_3$. Resistor 761, having a resistance of 32R kOhms, is coupled in parallel with switch 760, which operates in accordance with bit $B_4$. Accordingly, the resistance of variable resistor 700 can be controllably adjusted to one of 32 (2N) discrete values. When capacitor 610 is held constant, the RC time constant is discretely adjusted by controllably opening or closing one or more of switch 720, switch 730, switch 740, switch 750 and switch 760.

Alternative arrangements are possible and contemplated. For example, one or more resistors having various resistance values can be added to one or more of the illustrated resistors in a parallel coupled arrangement. By way of further example, the relationship between the resistance of anyone of the example resistors and the binary weight of the corresponding control bit may be changed. That is, instead of control bit Bo of output word 220 resulting in the addition of 2R kOhms of resistance to the overall value of variable resistor 700, if resistor 721 is replaced by a resistor having a resistance of 3R, the opening of switch 720, via bit Bo, adds a resistance that is no longer directly related to the binary value of output word 220.

Figure 8:
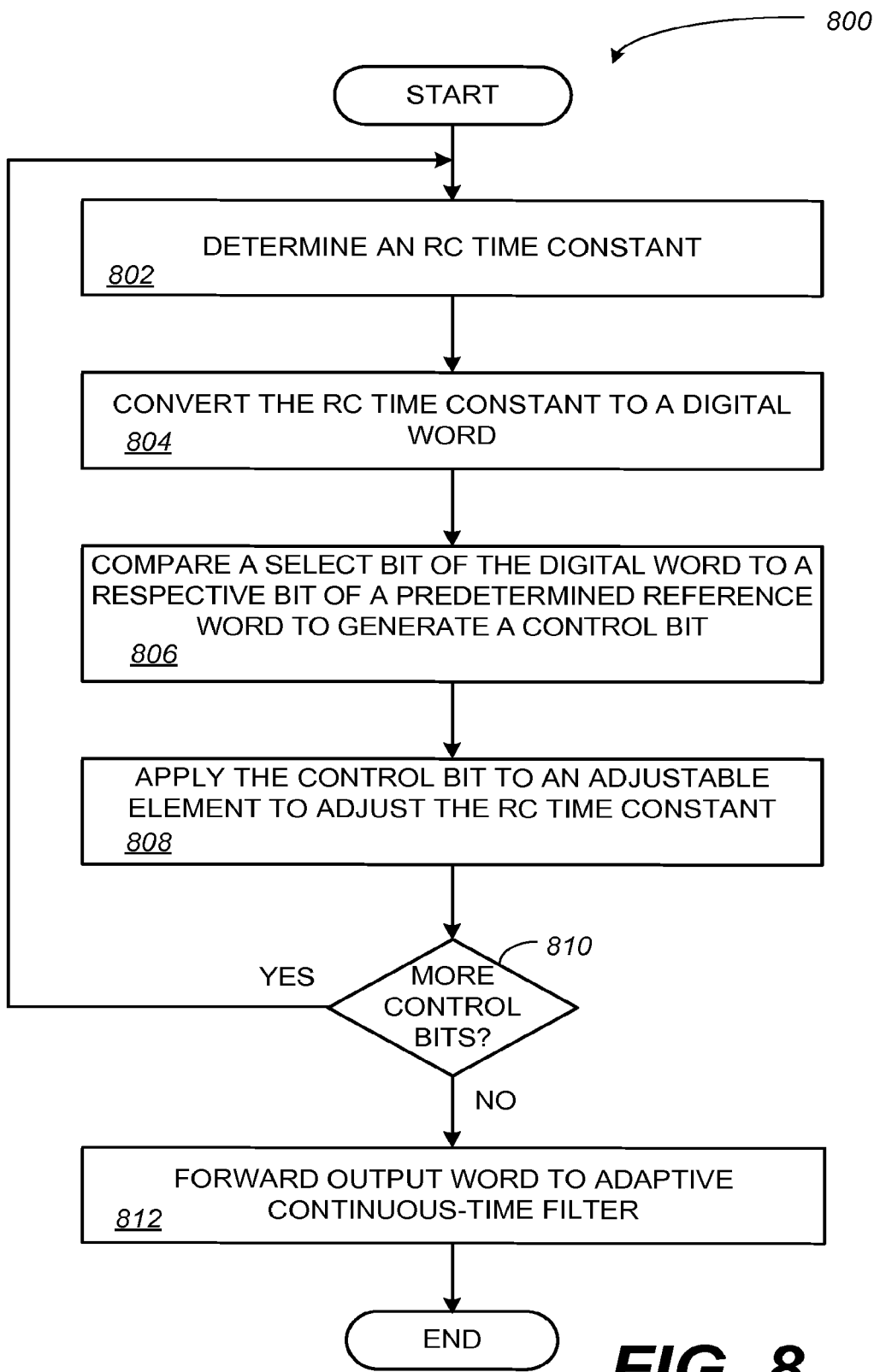
FIG. 8 is a flow diagram illustrating an embodiment of a method for adjusting a continuous-time filter.

FIG. 8 is a flow diagram illustrating an embodiment of a method 800 for adjusting an adaptive continuous-time filter. The flow diagram of FIG. 8 shows the functionality and operation of a possible implementation via circuit elements, software and or firmware associated with one or more communicatively coupled circuits or devices that can be used to generate a correction or output word. As described above, the output word can be forwarded to a control interface to adjust a continuous-time filter. In this regard, each block represents a function or set of functions that together describe an embodiment of a method for generating a control input that can be used to negate the effects of process variation on the respective resistance and capacitance values of semiconductor-based resistors and capacitors. In some embodiments, the function(s) associated with a block can be implemented and or otherwise modeled in a module, segment, or portion of code, which comprises one or more executable instructions for implementing the specified function(s).

Method 800 begins with block 802 where an RC time constant is determined. Next, in block 804, the RC time constant is converted to a digital word. Thereafter, as indicated in block 806, a select bit of the digital word is compared to a respective bit of a predetermined reference word to generate a control bit. In block 808, the control bit is applied to an adjustable element to adjust the RC time constant. In decision block 810 a determination is made as to whether each control bit has been processed. When it is determined that there are additional control bits to process, as indicated by the flow control arrow exiting decision block 810 labeled "YES," the functions associated with block 802 through block 808 are repeated. Otherwise, when it is determined that there are no control bits to process, as indicated by the flow control arrow exiting decision block 810 labeled "NO," processing continues with block 812 where an output word including the previously determined control bits is forwarded to an adaptive continuous-time filter.

While the flow diagram of FIG. 8 shows a specific sequence of execution, it will be appreciated that the functions associated with two or more blocks in the illustrated diagrams that are shown occurring in succession may be executed concurrently, with partial concurrence, or in an alternative sequence. For example, it is possible to forward each bit of the output word to a continuous-time filter as each bit is determined, rather than buffering each of the bits until a desired state of the last control bit to be processed is determined. In addition, any number of counters, state variables, warning semaphores, or messages might be added to the logical flow described herein, for purposes of enhanced utility, performance measurement, troubleshooting, etc. All such variations are within the scope of the present systems and methods for adjusting a continuous-time filter.

The foregoing description has been presented for purposes of illustration and description. It is not intended to be exhaustive or to limit the scope of the claims to the precise forms disclosed. Modifications or variations are possible in light of the above teachings. The embodiments discussed, however, were chosen and described to enable one of ordinary skill to utilize various embodiments of the phase-locked loop based controller and methods for adjusting an adaptive continuous-time filter. All such modifications and variations are within the scope of the appended claims when interpreted in accordance with the breadth to which they are fairly and legally entitled.

What is claimed is:

1. An apparatus comprising:
   an adaptive continuous-time filter including a first array of elements and a control input configured to receive an output word that generates a filter response to account for effects of semiconductor process variation in the first array of elements; and
   a controller configured to generate a digital word responsive to a time constant, to compare a select bit of the digital word to a corresponding reference word to generate a control bit, to apply the control bit to an adjustable element to modify the time constant, and to provide the output word to the adaptive continuous-time filter.

2. The apparatus of claim 1 wherein said controller includes a replicator which includes a duplicate first array of elements, the replicator generating a first signal having a frequency responsive to the time constant.

3. The apparatus of claim 2 wherein said controller is configured to generate the output word responsive to the semiconductor process variation in the semiconductor material used to implement the first array of elements and the duplicate first array of elements.

4. The apparatus of claim 2 wherein the replicator further includes an oscillator that is responsive to an enable signal and that generates the first signal based at least in part on the time constant.

5. The apparatus of claim 2 wherein said controller further includes a digitizer configured to receive the first signal from the replicator, the digitizer generating a control signal responsive to the first signal.

6. The apparatus of claim 5 wherein the digitizer includes an OR gate and a ripple counter, an input of the OR gate receiving the first signal, an input of the ripple counter receiving an output of the OR gate, the ripple counter producing a multiple-bit output.

7. The apparatus of claim 6 wherein the controller further includes a comparator and at least one successive approximation register, the comparator configured to compare respective bits of the multiple-bit output and a reference signal.

8. The apparatus of claim 7 wherein the comparator generates error bits when the respective bits of the multiple-bit output and the reference signal do not match, and the successive approximation register receives the error bits and generates bits of the output word.

9. The apparatus of claim 8 wherein the first array of elements receives the output word.

10. The apparatus of claim 9 wherein the duplicate first array of elements receives the output word to adjust the time constant.

11. A portable transceiver comprising the adaptive continuous-time filter of claim 1.

12. The apparatus of claim 1 wherein the first array of elements and the controller are implemented on a semiconductor die configured for use in a portable transceiver.

13. The apparatus of claim 1 wherein a cutoff frequency of the adaptive continuous-time filter is adjusted based at least in part on the output word to negate the effects of the semiconductor process variation in a semiconductor die that includes the first array of elements and the controller.

14. A method to adjust an adaptive continuous-time filter, the method comprising:
   generating a digital word responsive to a time constant;
   comparing a select bit of the digital word to a corresponding bit of a reference word to generate a control bit;
   applying the control bit to an adjustable element to modify the time constant; and
   providing an output word including the control bit to an adaptive continuous-time filter.

15. The method of claim 14 wherein the time constant is responsive to a ratio of resistances.

16. The method of claim 14 wherein the time constant is responsive to an astable multivibrator.

17. The method of claim 14 wherein applying the control bit includes controllably inserting a capacitor into a feedback path.

18. The method of claim 14 wherein applying the control bit includes controllably bypassing a resistor in a feedback path.

19. The method of claim 14 wherein the control bit is responsive to process variation in a semiconductor material used to generate the time constant.

20. The method of claim 14 further comprising selecting the reference word such that a determination of the output word includes operating an oscillator over only a portion of a controllable range of the oscillator.

* * * * *